(12) United States Patent
Cordesses et al.

(10) Patent No.: US 10,302,691 B2
(45) Date of Patent: May 28, 2019

(54) METHOD AND SYSTEM FOR ESTIMATING THE INSULATION RESISTANCE BETWEEN A BATTERY AND AN ELECTRICAL EARTH

(71) Applicant: RENAULT S.A.S., Boulogne-Billancourt (FR)

(72) Inventors: Lionel Cordesses, Montigny-le-Bretonneux (FR); Michel Mensler, Montigny-le-Bretonneux (FR); Sid-Ali Randi, Chambery (FR); Daniel Chatroux, Teche (FR); Sebastien Carcouet, Vif (FR)

(73) Assignee: RENAULT S.A.S., Boulogne-Billancourt (FR)

( * ) Notice: Subject to any disclaimer, the term of this patent is extended or adjusted under 35 U.S.C. 154(b) by 783 days.

(21) Appl. No.: 14/380,494

(22) PCT Filed: Feb. 15, 2013

(86) PCT No.: PCT/FR2013/050320
§ 371 (c)(1),
(2) Date: Jan. 23, 2015

(87) PCT Pub. No.: WO2013/124571
PCT Pub. Date: Aug. 29, 2013

(65) Prior Publication Data
US 2015/0226782 A1    Aug. 13, 2015

(30) Foreign Application Priority Data

Feb. 22, 2012 (FR) ...................................... 12 51591

(51) Int. Cl.
*H02H 3/00* (2006.01)
*G01R 31/12* (2006.01)
(Continued)

(52) U.S. Cl.
CPC ....... *G01R 31/1227* (2013.01); *G01R 27/025* (2013.01); *G01R 31/025* (2013.01)

(58) Field of Classification Search
USPC .................................... 324/509, 527; 320/22
See application file for complete search history.

(56) References Cited

U.S. PATENT DOCUMENTS 5,365,179 A    11/1994 Rogers
5,382,946 A    1/1995 Gale
(Continued)

OTHER PUBLICATIONS

International Search Report dated May 3, 2013, in PCT/FR2013/050320, filed Feb. 15, 2013.
(Continued)

*Primary Examiner* — Lam S Nguyen
(74) *Attorney, Agent, or Firm* — Oblon, McClelland, Maier & Neustadt, L.L.P.

(57) ABSTRACT

A method for estimating insulation resistance between a terminal of a battery and an electrical ground, including: connecting a measuring circuit to one terminal of the battery, the measuring circuit including a resistance of known value and a capacitance; application of a known input signal having an input voltage; measurement of an output voltage between the ground and a point located between the resistance of known value and the capacitance; determination of a complex impedance of a dipole of the capacitance and the insulation resistance or determination of parameters of a differential equation; and determination of the insulation resistance from the parameters of the differential equation or the complex impedance.

10 Claims, 2 Drawing Sheets

(51) Int. Cl.
    *G01R 27/02*    (2006.01)
    *G01R 31/02*    (2006.01)

(56) References Cited

U.S. PATENT DOCUMENTS

| | | | | |
|---|---|---|---|---|
| 5,698,964 | A * | 12/1997 | Kates | G06F 1/26 |
| | | | | 320/164 |
| 7,005,860 | B2 * | 2/2006 | Yamamoto | G01R 35/00 |
| | | | | 324/503 |
| 7,554,333 | B2 * | 6/2009 | Morita | B60L 3/0046 |
| | | | | 324/503 |
| 2004/0130326 | A1 | 7/2004 | Yamamoto | |
| 2007/0008666 | A1 | 1/2007 | Morita et al. | |

OTHER PUBLICATIONS

French Preliminary Search Report dated Nov. 13, 2012, in Patent Application No. FR 1251591, filed Feb. 22, 2012 (with English Translation of Category of Cited Documents).

* cited by examiner

METHOD AND SYSTEM FOR ESTIMATING THE INSULATION RESISTANCE BETWEEN A BATTERY AND AN ELECTRICAL EARTH

The technical field of the invention relates to the measurement of electric dipoles and, more particularly, the measurement of the isolation resistance within for example a vehicle comprising a high voltage battery.

In an electric vehicle or electric hybrid comprising a high voltage battery, the isolation resistance between a point of the battery linked to the high voltage (for example: the positive or negative terminal of the battery or a connector between the cells of the battery, or else a high voltage bus) and the electrical ground of the vehicle is an indispensable safety component. Indeed, it is the isolation resistance which makes it possible to prevent any electric shock to the passengers of the vehicle or to living organisms coming into contact with the vehicle.

It is indispensable to measure this resistance in order to detect then correct any isolation fault before a second isolation fault occurs. This is because a double fault may create a short-circuit. More generally, a double fault can be dangerous if a person touches the body of the vehicle, even if there is no short-circuit. For example, in the case where the positive terminal is connected to the body and the negative terminal is connected to earth, the user with their feet on the earth who touches the body is then in direct contact with the two positive and negative terminals of the battery.

The use of a measurement circuit connected to one or both terminals of the battery is known from the prior art. The idea is then to perform measurements at various locations of the measurement circuit, which renders the measurement complex.

The use of a measurement circuit comprising a coupling capacitance is also known from the prior art. The idea is then to measure the isolation resistance using the value of the coupling capacitance, which is assumed to be known.

For example, the patent application JP2003-250201 discloses a circuit for measuring the isolation resistance. The measurement circuit comprises a capacitance whose value is assumed to be known in order to carry out the measurement of the isolation resistance. However, ordinary capacitances generally have a value that varies as a function of temperature, of the voltage across their terminals or of their age. In order for this assumption to be well-founded and for the measurement to be reliable, it is therefore necessary to use a capacitance that is stable in value throughout its lifetime. This generally implies a higher cost with respect to an ordinary capacitance.

It therefore turns out that the existing measurement techniques are not reliable, are complex or involve a higher cost.

One goal of the invention is therefore to provide a method for measuring the isolation resistance aimed at finding a solution to the aforementioned drawbacks.

According to one embodiment and method of implementating of the invention, a simple measurement method is provided which only requires a single measurement point.

One subject of the invention is therefore a method for estimating the isolation resistance between a terminal of a battery and an electrical ground, comprising:
  connection of an output terminal of a measurement circuit to a terminal of the battery, said measurement circuit comprising a resistance of known value and a capacitance; and
  application of a known input signal having an input voltage to an input terminal of the measurement circuit.

According to one general feature, the method furthermore comprises:
  measurement of an output voltage between ground and a point situated between the resistance of known value and the capacitance;
  determination of a complex impedance of a dipole composed of the capacitance and of the isolation resistance or determination of the parameters of a differential equation connecting the output voltage and the input voltage; and
  determination of the isolation resistance using the parameters of the differential equation or said complex impedance.

It is thus possible to measure the isolation resistance with a single measurement point, without assuming the knowledge of the value of the capacitance of the measurement circuit. This is advantageous because it allows a simple and reliable measurement to be obtained with an ordinary capacitance.

According to one feature, the capacitance of the measurement circuit is also determined using the parameters of the differential equation or said complex impedance.

According to another feature, the input signal applied is a square-wave signal.

The square-wave signal has the advantage of being easy to generate and of containing numerous harmonics whose relative amplitudes are known.

According to one embodiment, the determination of the parameters of the differential equation comprises:
  filtering by a first order linear filter of the differential equation in order to obtain a second equation connecting the filtered input voltage and the filtered output voltage;
  determination, using the input voltage, of the filtered input voltage;
  determination, using the output voltage, of the filtered output voltage; and
  determination of the parameters of said second equation, said parameters of the second equation being equal to the parameters of the differential equation.

The use of a filtering allows the problem of calculating the derivatives of the input voltage and of the output voltage from the differential equation to be overcome. Specifically, these input and output voltages are noisy, a fact which renders the calculation of their derivative difficult.

According to one feature of this embodiment, said measurement of the output voltage is carried out at several different times and the determination of the parameters of said second equation uses a least squares method with the values at said several different times of the measured output voltage and of the input voltage.

It is thus possible, according to a simple method, to determine, using the second equation, the parameters of the differential equation. The values of the isolation resistance and of the capacitance of the measurement circuit will then be able to be deduced from these.

According to another embodiment, the method furthermore comprises a frequency analysis of the output voltage measured at at least one frequency in such a manner as to determine, for at least this frequency, the value of the complex impedance, said application of an input signal to the input terminal of the measurement circuit, said measurement of the output voltage, said frequency analysis and said determination of the value of the complex impedance being performed by a network analyzer.

The functionalities of the network analyzer may be reduced since it suffices to characterize a complex impedance in transmission, over a reduced frequency range and with a measurement precision of about ten percent.

According to one feature of this embodiment, the method furthermore comprises a digitization of the measured output voltage and the frequency analysis is carried out by means of a Fourier transform or of a Goertzel filtering of the digitized output voltage.

The frequency analysis can then be carried out according to a conventional method using the Fourier transform. Advantageously, the frequency analysis can use a Goertzel filtering. Goertzel filtering is faster than a Fourier transform since it does not need to calculate the whole of the spectrum but is limited to the calculation of one line of the spectrum of the Fourier transform.

According to one feature, the frequency analysis is performed at a fundamental frequency of the input voltage and/or at two harmonics of the input voltage.

It is then possible to determine an isolation resistance for the fundamental frequency and for each of the two harmonics. A triple determination allows the correct measurement to be chosen from amongst the three, by a voting system for example. It also allows the measurements to be rejected if there is a too large a dispersion between the three determinations.

Another subject of the invention is a system for estimating the isolation resistance between a terminal of a battery and an electrical ground, comprising a measurement circuit which comprises an output terminal, an input terminal, a resistance of known value and a capacitance, the output terminal being connected to a terminal of the battery and the input terminal being intended to receive a known input signal having an input voltage.

According to a general feature, the system furthermore comprises:
- a means of measurement of an output voltage between ground and a point situated between the resistance of known value and the capacitance;
- a means of determination of a complex impedance of a dipole composed of the capacitance and of the isolation resistance or of parameters of a differential equation connecting the output voltage and the input voltage; and
- a means of determination of the isolation resistance using the parameters of the differential equation or said complex impedance.

Other aims, features and advantages will become apparent upon reading the following description given merely by way of non-limiting example and with reference to the appended drawings in which.

Figure 1:
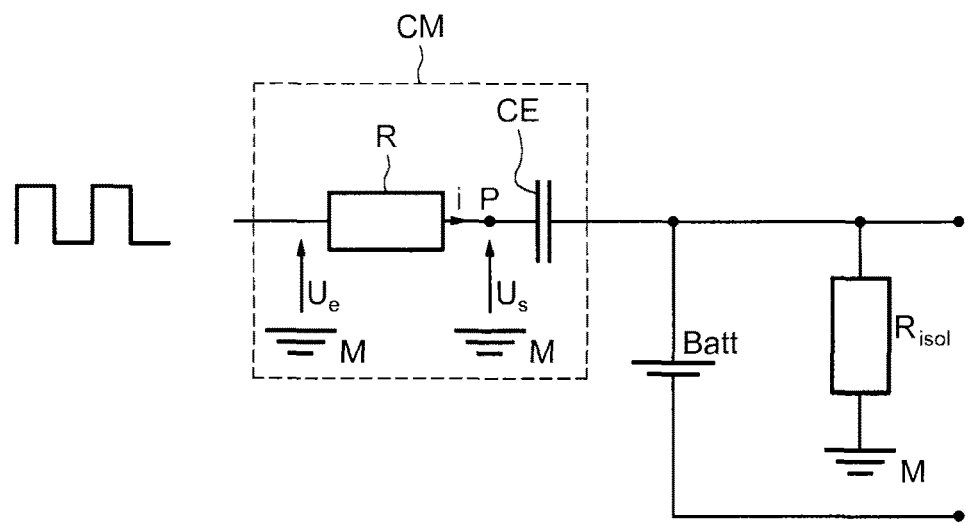
FIG. 1 illustrates a schematic diagram of a measurement circuit according to one embodiment of the invention.

In FIG. 1, a measurement circuit CM is shown comprising a resistance R and a capacitance CE, connected to a terminal of a high-voltage battery Batt equipping an electric vehicle. The battery Batt is for example a rear-wheel or front-wheel drive battery of the electric vehicle.

By means of the measurement circuit CM, an isolation resistance Risol can then be determined. The resistance Risol is the resistance between a terminal or any other point of the battery Batt and electrical ground M of the vehicle.

The measurement circuit CM comprises an input terminal intended to receive an input voltage Ue and an output terminal connected to one of the terminals of the battery Batt. The resistance R of the measurement circuit CM is of known value and the coupling capacitance CE of the measurement circuit has a value which will be determined.

For the determination of the capacitance CE, on the one hand, and the determination of the resistance Risol between the terminal to which the circuit CM is connected and ground, on the other hand, an output voltage Us will be measured across the terminals of a dipole which comprises the capacitance CE in series with the resistance Risol. For this purpose, the voltage between a point P and electrical ground M will be measured, said point P being situated between the resistance R and the capacitance CE.

Figure 2:
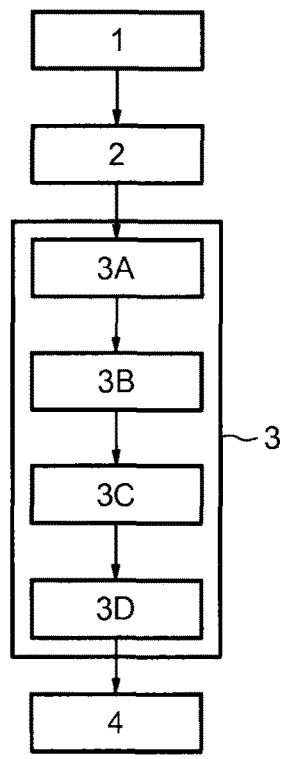
FIG. 2 illustrates a measurement method according to a first embodiment of the invention.

In FIG. 2, a measurement method is shown, according to a first embodiment, allowing the output voltage to be measured and the values of Risol and CE to be deduced from this. The method comprises:
- a first step (step 1) of application of an input signal, whose amplitude and frequency are known, to the input terminal of the measurement circuit CM. For example, the input signal is a square-wave voltage Ue with a frequency of 0.5 Hz taking as high value 5 volts and as low value 0 volts.
- a second step (step 2) of measurement of the output voltage Us;
- a third step (step 3) of determination of parameters of a differential equation between the input voltage Ue and the output voltage Us. This differential equation is obtained using a transfer function, for example.

For this purpose, the relationship of a voltage divider is applied to the circuit comprising, in series, the resistance R, the coupling capacitance CE and the isolation resistance Risol. The following transfer function is then obtained:

$$\frac{U_s}{U_e} = \frac{1 + R_{isol} \cdot CE \cdot s}{1 + CE \cdot (R_{isol} + R) \cdot s}$$

in which s is the Laplace variance.

The corresponding differential equation is then deduced from this transfer function. The following relationship is used:

$$a_0 \cdot u_s(t) + \dot{u}_s(t) = b_0 \cdot u_e(t) + b_1 \cdot \dot{u}_e(t) \qquad \text{(Equation 1)},$$

with the following change of variables:

$$\begin{cases} R_{isol} \cdot CE = \dfrac{b_1}{a_0} \\ CE \cdot (R_{isol} + R) = \dfrac{1}{a_0} \end{cases}$$

$$\begin{cases} R_{isol} = R \cdot \dfrac{b_1}{1 - b_1} \\ CE = \dfrac{1}{R} \cdot \dfrac{1 - b_1}{a_0} \end{cases}$$

This first equation (Equation 1) will then be used to determine the parameters $a_0$, $b_0$ and $b_1$.

For this purpose, the method known as the PMF (Poisson Moment Functional) method is applied to equation 1. For this purpose, step 3 of the method comprises:
- a step (step 3A) of filtering the differential equation (equation 1) by a filter F1 of the first order of the form:

$$\varphi(s) = \frac{\lambda}{s + \lambda},$$

in which the parameter λ is a parameter for adjustment of the PMF method. It may for example be fixed as a function of the value of the bandwidth of the system to be identified.

The following is then obtained:

$$a_0 F_1\{u_s(t)\} + F_1\{\dot{u}_s(t)\} = b_0 F_1\{u_e(t)\} + b_1 F_1\{\dot{u}_e(t)\} \quad \text{(Equation 2)},$$

in which $F_1\{\ \}$ signifies the filtering by the filter F1. A second equation is thus obtained comprising the filtered input voltage and the filtered output voltage.

The employment of the filter F1 allows the difficulty represented by the calculation of the direct time derivatives of the input and output signals $\dot{u}_s(t)$ and $\dot{u}_e(t)$ to be avoided. This is because the calculation of these derivatives is rendered difficult by the presence, in the real case, of noise affecting the signals $u_s(t)$ and $u_e(t)$.

The method also comprises:
determination (3B) of the input voltage filtered by the filter F1, $F_1\{u_e(t)\}$, and of the input voltage derivative filtered by the filter F1, $F_1\{\dot{u}_e(t)\}$; and
determination (3C) of the output voltage filtered by the filter F1, $F_1\{u_s(t)\}$, and of the output voltage derivative filtered by the filter F1, $F_1\{\dot{u}_s(t)\}$.

In order to calculate the terms $F_1\{u_e(t)\}$, $F_1\{\dot{u}_e(t)\}$, $F_1\{u_s(t)\}$ and $F_1\{\dot{u}_s(t)\}$ and to carry out the two steps 3B and 3C, use is made of the measured output voltage Us, the input voltage Ue of known value and the following equations:

$$\begin{cases} \dot{z}(t) = Az(t) + Bx(t) \\ X(t) = Cz(t) \end{cases} \quad \text{(Equation 3)}$$

in which, $$A = \begin{bmatrix} -\lambda & 0 \\ \lambda & -\lambda \end{bmatrix};$$

$$B = \begin{bmatrix} \lambda \\ 0 \end{bmatrix};$$

$$C = \begin{bmatrix} \lambda & -\lambda \\ 0 & 1 \end{bmatrix}$$

$$z(t) = \begin{bmatrix} F_0\{x(t)\} \\ F_1\{x(t)\} \end{bmatrix};$$

$$X(t) = \begin{bmatrix} F_1\{\dot{x}(t)\} \\ F_1\{x(t)\} \end{bmatrix}$$

in which x(t) is the signal $U_s(t)$ or $U_e(t)$.

Then, the method comprises a step 3D during which the parameters of said second equation are determined.

For this purpose, given that the terms $F_1\{u_s(t)\}$, $F_1\{\dot{u}_s(t)\}$, $F_1\{u_e(t)\}$ and $F_1\{\dot{u}_e(t)\}$ are known from steps 3B and 3C, the parameters $a_0$, $b_0$ and $b_1$ of equation 2, $F_1\{\dot{u}_s(t)\} = -a_0 F_1\{u_s(t)\} + b_0 F_1\{u_e(t)\} + b_1 F_1\{\dot{u}_e(t)\}$ may be deduced using for example a method known as "least-squares".

In order to carry out the least-squares method, the time parameter t is made to vary from $t_1$ to $t_N$ in equation 2. By way of exemplary embodiment, for example with a sampling period of 10 ms and a square-wave signal Ue(t) of 0.5 Hz, a variation of the time parameter can be provided in such a manner as to cover one period of the signal Ue(t). The time parameter might also be made to vary over a larger interval so as to obtain a better estimation of the parameters of equation 2.

By virtue of this variation, the following matrix form can then be obtained:

$$Y = \Gamma\Theta \quad \text{(Equation 4)}$$

in which:

$$Y = \begin{bmatrix} F_1\{\dot{u}_s(t_1)\} \\ \vdots \\ F_1\{\dot{u}_s(t_N)\} \end{bmatrix};$$

$$\Gamma = \begin{bmatrix} -F_1\{u_s(t_1)\} & F_1\{u_e(t_1)\} & F_1\{\dot{u}_e(t_1)\} \\ \vdots & \vdots & \vdots \\ -F_1\{u_s(t_N)\} & F_1\{u_e(t_N)\} & F_1\{\dot{u}_e(t_N)\} \end{bmatrix};$$

$$\Theta = \begin{bmatrix} a_0 \\ b_0 \\ b_1 \end{bmatrix}$$

The vector $\Theta$ of the parameters to be determined can therefore be calculated such that:

$$\Theta = (\Gamma^T \Gamma)^{-1} \Gamma^T Y \quad \text{(Equation 5)},$$

in which "$^T$" denotes the transpose and "$^{-1}$" denotes the matrix inversion operation.

Finally, the method comprises a fourth step (step 4) of determination of the isolation resistance Risol and of the capacitance CE using said parameters. For this purpose, the change of variables from equation 1 is used:

$$\begin{cases} R_{isol} \cdot CE = \dfrac{b_1}{a_0} \\ CE \cdot (R_{isol} + R) = \dfrac{1}{a_0} \end{cases}$$

$$\begin{cases} R_{isol} = R \cdot \dfrac{b_1}{1 - b_1} \\ CE = \dfrac{1}{R} \cdot \dfrac{1 - b_1}{a_0} \end{cases}$$

The measurement method presented thus allows the value of the isolation resistance Risol and of the capacitance CM to be estimated at the end of only one implementation of the method illustrated.

According to another exemplary application, iterative identification methods might also be provided according to which the value of the isolation resistance Risol and of the capacitance CE are calculated, then these calculated values are updated by virtue of the illustrated measurement method carried out at each iteration.

The calculation steps 3A, 3B, 3C, 3D and 4 are for example implemented by one or more calculation blocks integrated into a digital processing unit. The calculation blocks implementing steps 3A, 3B, 3C, 3D and 4 may take the form of software modules or else, for some of them, the form of logic circuits.

For the determination of the resistance Risol and of the capacitance CE, according to a second embodiment, the complex impedance Z in transmission of the dipole illustrated in FIG. 1 comprising the capacitance CE in series with the resistance Risol can be measured.

The complex impedance Z in transmission is connected to the output voltage Us by the impedance equation below:

$$\underline{Us} = Z \cdot \underline{i} \quad \text{(Equation 6)}$$

in which,

Us and i are respectively the output voltage Us and an intensity i which is written into the dipole as an exponential.

A network analyzer is used for measuring the complex impedance Z.

The network analyzer is connected to the input terminal of the measurement circuit CM so as to send an input signal having a voltage Ue whose amplitude and frequency are known. The network analyzer will also measure the output voltage Us at the terminals of the dipole. For this purpose, an analog-digital converter is used between the network analyzer and the measurement circuit. The analog-digital converter will sample the voltage Us, which will then be transmitted in a sampled form to the network analyzer.

Figure 3:
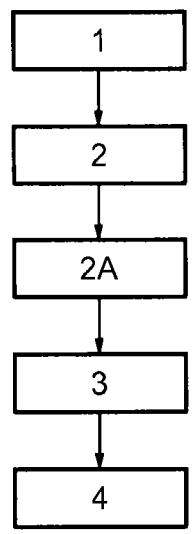
FIG. 3 illustrates a measurement method according to a second embodiment of the invention.

In FIG. 3, the measurement method according to the second embodiment is shown allowing the value of the isolation resistance Risol and of the capacitance CE of the measurement circuit CM to be determined using the measurement of the complex impedance.

This method comprises:
application (step 1) of an input signal, of voltage Ue, to the input of the measurement circuit. This application is implemented by the network analyzer which can for example generate an input voltage Ue on the input terminal of the circuit CM;
measurement (step 2) of the output voltage Us across the terminals of the electric dipole comprising the capacitance CE of the measurement circuit CM and the isolation resistance Risol. This measurement is carried out by means of an analog-digital converter which will digitize (step 2A) the voltage Us in order to transmit it in a sampled form to the network analyzer;
determination (step 3) of the complex impedance Z of the dipole. The determination step comprises a frequency analysis of the digitized output voltage at least one frequency f and the calculation of the angle and of the modulus of the complex impedance Z for each of the angular frequencies f corresponding to the frequencies f ($\Omega=2\pi \cdot f$ according to a formula well known to those skilled in the art). This determination furthermore comprises a calculation of the value of the complex impedance of the dipole for each of the angular frequencies $\Omega$ using the modulus and the angle of the impedance Z, according to the equation hereinbelow:

$$Z=R \cdot e^{i\theta},$$

in which R represents the modulus of the complex impedance Z and $\theta$ represents the angle (or phase) of the complex impedance Z.

The determination step is carried out by the network analyzer.

According to one embodiment, the frequency analysis is carried out over an interval of frequencies (for example from 1 kHz to 5 kHz depending on the nominal value of the components R, Risol and CE) and comprises a fast Fourier transform, or FFT (according to an acronym well known of those skilled in the art), of the digitized output voltage.

According to another embodiment, the frequency analysis may be carried out by means of a Goertzel filtering. The Goertzel filtering is faster since, in contrast to the Fourier transform, it does not require the whole of the spectrum to be calculated but is limited to the calculation of one spectral line of the sampled Fourier transform.

According to these two embodiments, a square-wave signal, for which the relative amplitude of the various frequency components is known, may be used as input signal. More precisely, with a square-wave signal taking the values +1 or −1, the amplitude of the component of the square-wave signal at the fundamental frequency is $4/\pi$, the amplitude of the $3^{rd}$ harmonic is $4/(3 \cdot \pi)$ and the amplitude of the $5^{th}$ harmonic is $4/(5 \cdot \pi)$.

In the case of the Goertzel filtering, the frequency analysis can be carried out only on the spectral lines corresponding to the fundamental frequency, the $3^{rd}$ harmonic and the $5^{th}$ harmonic of the input signal of voltage Ue.

In the case of the Fourier transform, the analysis of a part of the spectrum of the signal of voltage Ue comprising these frequencies can be carried out.

In the case of the Goertzel filtering or of the Fourier transform, for each of the lines of the fundamental frequency, of the $3^{rd}$ harmonic and of the $5^{th}$ harmonic, the modulus of the complex impedance and the phase of the complex impedance are deduced using respectively the ratio of the amplitudes of the output voltage and of the input signal, and the phase difference between the output voltage and the input signal. The complex impedance for the angular frequencies corresponding to each of these lines can then be calculated.

According to one embodiment, the frequency of the input signal corresponding to said fundamental frequency will be chosen so as to minimize the signal-to-noise ratio of the spectrum of the output voltage. This is possible for example by avoiding the frequencies associated with power electronics, such as an inverter for example, in another part of the electronics of the vehicle or by avoiding the problems associated with the spectral aliasing of the signals from the power electronics.

The frequency of the input signal may also be chosen as a function of the nominal value of the components R, Risol and CE. Or alternatively, the frequency of the input signal may be chosen in such a manner that the capacitance CE to be used is small. This is because in general the higher the capacitance, the higher its cost.

The method furthermore comprises:
determination (step 4) of the value of the isolation resistance Risol and of the capacitance CE of the measurement circuit CM using the impedance for at least one frequency being considered. For this purpose, the equation hereinbelow is used:

$$Z=Z1+i \cdot Z2=R \cdot e^{i\theta}$$

$$Risol=-((Z1^2-Z1+Z2^2) \cdot R)/(Z1^2-2 \times Z1+Z2^2+1)$$

$$CE=(Z1^2-2 \times Z1+Z2^2+1)/(\Omega \cdot Z2 \cdot R) \quad \text{(Equation 7),}$$

in which Z1 and Z2 respectively represent the real part and the imaginary part of the complex impedance Z, and $\Omega$ represents the angular frequency for which the complex impedance has been determined.

The calculation step 4 is for example implemented by a calculation block integrated into a digital processing unit of the network analyzer. The calculation block implementing step 4 may take the form of software modules or else the form of logic circuits.

For example, in the case where the complex impedances have been evaluated for several frequencies, a value of the isolation resistance Risol may be deduced from each of the complex impedances. The various isolation resistances may then be compared in order to check the relevance of the measurement.

Furthermore, the measurement of the capacitance CE, in the case where the measurement circuit is permanently installed on the terminal of the battery Batt, if the value of the capacitance CE drifts away from its nominal value, allows an aging of the capacitance to be detected. In the case for example of an abnormal aging, this allows a onboard diagnostic function for the electronics of the vehicle to be obtained.

According to one exemplary application of the two embodiments, which is illustrated in FIG. 2 or 3, what is more particularly important is to detect a malfunction. An estimation allowing it to be determined whether the value of the isolation resistance is less than a certain value can then be sufficient for detecting an isolation fault. This thus allows the constraints on precision of the measurement to be reduced (the measurement interval to be reduced, the precision of the resistance R or of the signal Ue to be reduced) and therefore the cost of the estimation solution to be reduced or the estimation solution to be made faster. For example, in the case of a 400 volt battery, it is sufficient to determine that the isolation resistance has a value of less than 1 MegaOhm.

The invention claimed is:

1. A method for estimating isolation resistance between a terminal of a battery and an electrical ground, comprising:
   connecting an output terminal of a measurement circuit to a terminal of the battery, the measurement circuit comprising a resistance of known value and a capacitance;
   applying a known input signal having an input voltage to an input terminal of the measurement circuit;
   measuring an output voltage between ground and a point situated between the resistance of known value and the capacitance;
   determining parameters of a differential equation connecting the output voltage and the input voltage; and
   determining the isolation resistance using the parameters of the differential equation.

2. The method as claimed in claim 1, further comprising determining the capacitance of the measurement circuit using the parameters of the differential equation.

3. The method as claimed in claim 1, in which the input signal applied is a square-wave signal.

4. The method as claimed in claim 1, in which the determining the parameters of the differential equation further comprises:
   filtering by a first order linear filter of the differential equation to obtain a second equation connecting the filtered input voltage and the filtered output voltage;
   determining, using the input voltage, the filtered input voltage;
   determining, using the output voltage, the filtered output voltage; and
   determining the parameters of the second equation, the parameters of the second equation being equal to the parameters of the differential equation.

5. The method as claimed in claim 4, in which the measurement of the output voltage is carried out at plural different times and the determination of the parameters of the second equation uses a least squares method with the values at the plural different times of the measured output voltage and of the input voltage.

6. The method as claimed in claim 1, further comprising a frequency analysis of the output voltage measured at at least one frequency to determine, for at least the frequency, a value of complex impedance, the application of an input signal to the input terminal of the measurement circuit, the measurement of the output voltage, the frequency analysis, and the determination of the value of the complex impedance being performed by a network analyzer.

7. The method as claimed in claim 6, further comprising digitizing the measured output voltage and the frequency analysis is carried out by a Fourier transform or of a Goertzel filtering of the digitized output voltage.

8. The method as claimed in claim 7, in which the frequency analysis is performed at a fundamental frequency of the input voltage and/or at two harmonics of the input voltage.

9. A system for estimating isolation resistance between a terminal of a battery and an electrical ground, comprising:
   a measurement circuit which comprises an output terminal, an input terminal, a resistance of known value and a capacitance, the output terminal being connected to a terminal of the battery and the input terminal configured to receive a known input signal having an input voltage;
   a means of measurement of an output voltage between ground and a point situated between the resistance of known value and the capacitance;
   a means of determination of parameters of a differential equation connecting the output voltage and the input voltage; and
   a means of determination of the isolation resistance using the parameters of the differential equation.

10. A system for estimating isolation resistance between a terminal of a battery and an electrical ground, comprising:
    a first measurement circuit which comprises an output terminal, an input terminal, a resistance of a known value and a capacitance, the output terminal being connected to a terminal of the battery and the input terminal configured to receive a known input signal having an input voltage;
    a second measurement circuit that measures an output voltage between ground and a point situated between the resistance of the known value and the capacitance; and
    processing circuitry configured to
       determine parameters of a differential equation connecting the output voltage and the input voltage, and
       determine of the isolation resistance using the parameters of the differential equation.

* * * * *